(12) United States Patent
Zhang

(10) Patent No.: US 11,656,700 B2
(45) Date of Patent: May 23, 2023

(54) IMAGE CAPTURING DEVICE AND ELECTRONIC EQUIPMENT COMPRISING THE SAME

(71) Applicant: Shanghai Harvest Intelligence Technology Co., Ltd., Shanghai (CN)

(72) Inventor: Wenying Zhang, Shanghai (CN)

(73) Assignee: Shanghai Harvest Intelligence Technology Co., Ltd., Shanghai (CN)

( * ) Notice: Subject to any disclaimer, the term of this patent is extended or adjusted under 35 U.S.C. 154(b) by 0 days.

(21) Appl. No.: 16/821,479

(22) Filed: Mar. 17, 2020

(65) Prior Publication Data

US 2020/0301536 A1    Sep. 24, 2020

(30) Foreign Application Priority Data

Mar. 21, 2019   (CN) .................. 201910220474.X

(51) Int. Cl.
*G06F 3/041*  (2006.01)
*H01L 27/32*  (2006.01)
(Continued)

(52) U.S. Cl.
CPC ............ *G06F 3/0412* (2013.01); *G06F 3/042* (2013.01); *H04M 1/0264* (2013.01);
(Continued)

(58) Field of Classification Search
CPC ...... G06F 3/0412; G06F 3/042; G06F 3/0425; H01L 27/323; H01L 27/3234; H01L 27/14678; H04M 1/0264; H04M 1/0266; H04M 2250/12; H04M 1/026; G06K 9/00255; G06K 9/0004; G06K 9/00053; G06K 9/00201; G06K 9/00228; G06K 9/00288

See application file for complete search history.

(56) References Cited

U.S. PATENT DOCUMENTS

| | | | |
|---|---|---|---|
| 2009/0128508 A1* | 5/2009 | Sohn ..................... | G06F 3/0421 345/173 |
| 2014/0168167 A1* | 6/2014 | Chou .................. | G06K 9/00026 345/175 |

(Continued)

FOREIGN PATENT DOCUMENTS

JP         2005010407 A  *  1/2005  ........... G09G 3/3208

*Primary Examiner* — David D Davis
(74) *Attorney, Agent, or Firm* — Harness, Dickey & Pierce, P.L.C.

(57) ABSTRACT

The present disclosure provides an image capturing device and an electronic equipment. The image capturing device includes: a protective layer, a display panel, a first image sensing module, an optical imaging element and a second image sensing module. The protective layer is disposed on a first side of the display panel and has a first surface. The display panel includes a plurality of display pixels configured to emit a first light signal. The first image sensing module is configured to receive a reflected light signal formed by the first light signal reflected on the first surface. The optical imaging element is configured to conduct optical imaging according to a second light signal received from an object above the first surface of the protective layer. The second image sensing module is configured to receive the second optical signal imaged by the optical imaging element.

15 Claims, 3 Drawing Sheets

(51) Int. Cl.
*G06F 3/042* (2006.01)
*H04M 1/02* (2006.01)
*G06V 40/16* (2022.01)
*G06V 40/13* (2022.01)
*G06K 9/00* (2022.01)
*H01L 27/146* (2006.01)

(52) U.S. Cl.
CPC ............. *H10K 59/40* (2023.02); *H10K 59/65* (2023.02); *G06V 40/1318* (2022.01); *G06V 40/1329* (2022.01); *G06V 40/166* (2022.01); *H01L 27/14678* (2013.01)

(56) References Cited

U.S. PATENT DOCUMENTS

2016/0266695 A1\* 9/2016 Bae ..................... G06F 3/04166
2019/0012555 A1\* 1/2019 Bae ..................... G06V 40/1324

\* cited by examiner

IMAGE CAPTURING DEVICE AND ELECTRONIC EQUIPMENT COMPRISING THE SAME

CROSS-REFERENCE TO RELATED APPLICATIONS

This application claims the benefit of priority to Chinese patent application No. 201910220474.X, filed on Mar. 21, 2019. The entire contents of this application are hereby incorporated herein by reference.

TECHNICAL FIELD

The present disclosure relates to the technical field of image capturing technology, and more particularly to an image capturing device and an electronic equipment.

BACKGROUND

With the development of industrial design and the popularity of full-screen smart devices, under-screen fingerprint recognition technology has emerged as the time requires. Compared with traditional front-scraping or press-type fingerprint unlocking technologies, under-screen fingerprint recognition technology can further improve appearance and user experience of the smart devices.

At present, the mainstream of under-screen fingerprint recognition technologies mainly includes optical fingerprint recognition technology and ultrasonic fingerprint recognition technology. The optical fingerprint recognition technology uses light from a display screen of a mobile phone as a light source to illuminate a finger area to obtain a fingerprint image. This technology has reached its maturity during the last three years. Many suppliers in the industry chain have realized mass production of optical under-screen fingerprint sensors and they have been applied in a variety of smart products at this stage.

Nowadays, in addition to fingerprint recognition, face recognition and iris recognition have become a new breakthrough in the era of full-screen as two other biometric recognition technologies. Iris recognition is a high-security biometric recognition technology because of its low misrecognition rate. However, its higher cost increases the pressure on mobile phone manufacturers. The principle of face recognition technology lies in that the camera collects 2D images containing faces, supplemented by a structured light scheme and a dual-shot algorithm to achieve the recognition function. The advantage of 3D face recognition lies in the high resolution of the image quality. The sweeping trend of 3D cameras in the smart phones also provides opportunities for face recognition technology.

SUMMARY

Embodiments of the present disclosure provide an image capturing device, which makes a full-screen smart device have a variety of biometric recognition functions and improve the security of biometric recognition by virtue of an integrated structure design.

An embodiment of the present disclosure provides an image capturing device, including: a protective layer, a display panel, a first image sensing module, an optical imaging element and a second image sensing module. The protective layer is disposed on a first side of the display panel along a thickness direction of the display panel and has a first surface configured for being contacted by a part to be detected. The display panel includes a plurality of display pixels configured to emit a first light signal. The first image sensing module, the optical imaging element and the second image sensing module are disposed on a second side of the display panel along the thickness direction of the display panel. The first image sensing module is configured to receive a reflected light signal formed by the first light signal reflected on the first surface of the protective layer. The optical imaging element is configured to conduct optical imaging according to a second light signal received from an object above the first surface of the protective layer. The second image sensing module is configured to receive the second light signal imaged by the optical imaging element.

In some embodiment, the first image sensing module is disposed between the display panel and the optical imaging element.

In some embodiment, the first image sensing module is attached to a surface of the second side of the display panel along the thickness direction of the display panel.

In some embodiment, there is a first distance between the optical imaging element and the display panel, and a second distance between the optical imaging element and the second image sensing module.

In some embodiment, the display panel is disposed on an object-side focal plane of the optical imaging element, and the second image sensing module is disposed outside an image-side focal plane of the optical imaging element.

In some embodiment, the second distance is adjustable within a preset range, and the preset range is set in such a way that an object located above the first surface of the protective layer and at a distance from the first surface within a range of 0.1 m to 1 m forms a clear image in the second image sensing module.

In some embodiment, the optical imaging element is disposed opposite to the first image sensing module, and an area of the first image sensing module opposite to the optical imaging element has light transmittance.

In some embodiment, a surface of the second side of the display panel along the thickness direction of the display panel includes a first region and a second region outside the first region. The first image sensing module is disposed in the first region, and the optical imaging element is disposed opposite to the second region. The second light signal successively passes through the protective layer and the display panel, and is received by the optical imaging element.

In some embodiment, the image capturing device further includes an optical filtering element disposed between the display panel and the first image sensing module. The optical filtering element is configured to transmit light having incident angle and wavelength which meet preset conditions, and to filter out light having incident angle and wavelength which do not meet the preset conditions.

In some embodiment, an area of the optical filtering element opposite to the optical imaging element is provided with an opening.

In some embodiment, the image capturing device further includes a reflective film disposed on a surface of the second side of the display panel along the thickness direction of the display panel. The reflective film is configured to reflect the first light signal emitted by the display pixels toward the first image sensing module.

In some embodiment, an area of the reflective film opposite to the optical imaging element is provided with an opening.

In some embodiment, the image capturing device further includes a processing module, wherein the processing module is configured to transmit a display driving signal to the display panel, to generate a first image information according to the reflected light signal received by the first image sensing module, and to generate a second image information according to the second light signal received by the second image sensing module.

In some embodiment, the image capturing device further includes a touch screen, wherein the touch screen is disposed between the protective layer and the display panel and configured to detect a touch signal from the first surface of the protective layer, and the processing module is configured to transmit the display driving signal to the display panel when the touch screen detects the touch signal.

In some embodiment, the protective layer includes a light transmitting cover plate, the display panel includes a self-luminous display screen, such as Organic Light Emitting Diode (OLED) display screen, the first image sensing module includes a plurality of photosensitive pixels, each photosensitive pixel includes a pixel circuit and a photosensitive element, the pixel circuit includes a thin film transistor, and the photosensitive element includes a photodiode or phototransistor; and/or the second image sensing module includes a CMOS image sensor.

Another embodiment of the present disclosure provides an electronic equipment, including a processor, a memory and an image capturing device according to the preceding embodiments of the present disclosure.

In some embodiment, the electronic equipment includes a mobile phone or a tablet computer.

Compared with the prior art, embodiments of the present disclosure have the following beneficial effects.

The image capturing device according to the embodiment of the present disclosure has both near-field and mid-field imaging functions, wherein the protective layer, the display panel, and the first image sensing module constitute the near-field imaging module, which can conduct optical imaging for an object near the first surface of the protective layer (such as an object in contact with the first surface of the protective layer); the optical imaging element and the second image sensing module constitute the mid-field imaging module, which can conduct optical imaging for an object having a distance from the first surface of the protective layer within a preset range. The near-field imaging module can be used for under-screen fingerprint recognition, and the mid-field imaging module can be used for under-screen face recognition, so the image capturing device can realize both under-screen fingerprint recognition and under-screen face recognition through an integrated structural design, which improves the function integration degree of the image capturing device applied in a full-screen smart device.

Further, the display panel is disposed on the object-side focal plane of the optical imaging element, so that a display image on the display panel can be imaged at infinity through the optical imaging element, thereby preventing the display image on the display panel from interfering the second light signal received from the object by the second image sensing module, and improving the signal-to-noise ratio of the image collected by the second image sensing module. The second image sensing module is disposed outside the image-side focal plane of the optical imaging element, so that the optical imaging element can clearly image the object having a distance from the first surface of the protective layer within a preset range to the second image sensing module.

Further, the optical imaging element is disposed opposite to the first image sensing module, and the area of the first image sensing module directly opposite to the optical imaging element has light transmittance, which enhances the intensity of the second light signal received by the second image sensing module, so as to improve the signal-to-noise ratio of the collected image.

Further, the image capturing device includes the optical filtering element, which can filter out ambient light and only allow signal light meeting the band-pass condition to pass through, thus improving the signal-to-noise ratio of the image collected by the first image sensing module. The area of the optical filtering element opposite to the optical imaging element is provided with the opening, which can prevent the optical filtering element from filtering out the second light signal from the object above the surface of the protective layer, and realize the compatibility between the near-field imaging and the far-field imaging.

Further, the image capturing device includes the reflective film disposed on the surface of the second side of the display panel along its thickness direction and configured to reflect the first light signal emitted by the display pixels toward the first image sensing module, which enhances the intensity of the first light signal to the first surface of the protective layer used for collecting fingerprint image on one hand, and reduces the intensity of the first light signal emitted by the display panel and directly entering the first image sensing module on the other hand. Therefore, the signal-to-noise ratio of the image collected by the first image sensing module is improved. The area of the reflective film opposite to the optical imaging element is provided with the opening, which can prevent the reflective film from blocking the second light signal from the object above the first surface of the protective layer, and realize the compatibility between the near-field imaging and the far-field imaging.

The electronic equipment according to the embodiment of the present disclosure includes the image capturing device, and have the capturing function of near-field and far-field images through the integrated structure design, and can be applied for both under-screen fingerprint recognition and under-screen face recognition.

DETAILED DESCRIPTION

In order to make above purposes, features and beneficial effects of the present disclosure more obvious and understandable, specific embodiments of the present disclosure will be described in detail below in combination with attached drawings. Each embodiment in the specification is described in a progressive manner, and each embodiment focuses on the differences from other embodiments. The same or similar parts of each embodiment can be referred to each other.

Figure 1:
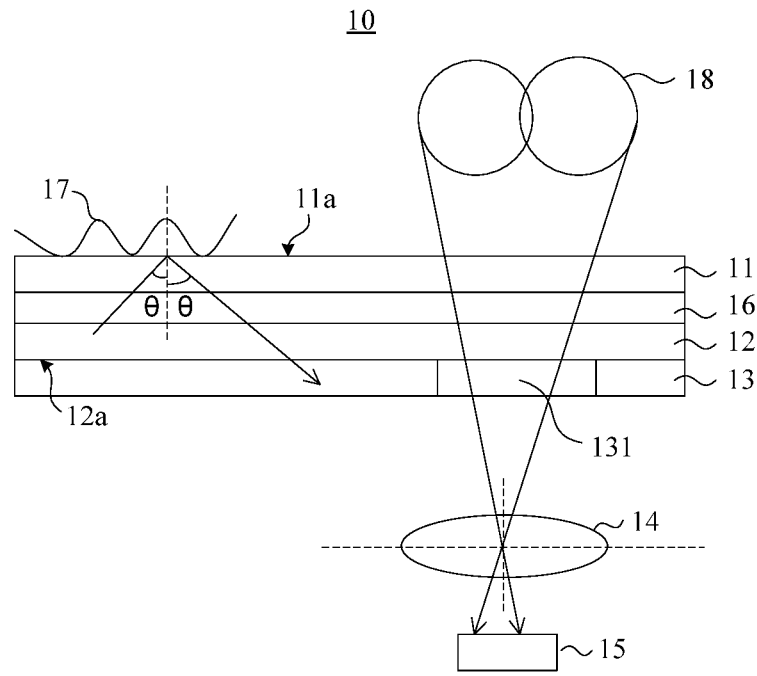
FIG. 1 is a structural schematic view of an image capturing device 10 according to an embodiment of the present disclosure.

Referring to FIG. 1, FIG. 1 is a structural schematic view of an image capturing device 10 according to an embodiment of the present disclosure. In some embodiments, the image capturing device 10 may include a protective layer 11, a display panel 12, a first image sensing module 13, an optical imaging element 14, and a second image sensing module 15.

The protective layer 11 is disposed on a first side of the display panel 12 along a thickness direction of the display panel 12. The protective layer 11 has a first surface 11a configured for being contacted by a part to be detected. In some embodiments, the protective layer 11 may have a single-layer structure or a multi-layer structure. The single-layer structure can be a cover glass (CG) or an organic light transmitting cover plate, or a cover plate with other functions, such as a touch screen. The multi-layer structure can be a multi-layer cover glass, a multi-layer organic light transmitting material cover plate, or a combination of a cover glass and an organic light transmitting material cover plate. The part to be detected can be a part with texture information of physiological characteristics such as fingers or palms.

The display panel 12 includes a plurality of display pixels configured to emit a first light signal, which can not only be used to display an image, but also used as a light source for the image capturing device 10 to capture an image. In some embodiments, the display panel 12 may include a self-luminous diode array, for example, the display panel 12 may be an organic light emitting diode (OLED) display, or a micro-light emitting diode (micro-LED) display, etc. A single or multiple pixels in the display panel 12 is configured to act as light sources and to transmit the first light signal in different directions toward the first surface 11a of the protective layer 11. The first light signal is reflected on the first surface 11a of the protective layer 11 to form reflected light signal in different directions.

The first image sensing module 13, the optical imaging element 14 and the second image sensing module 15 are all disposed on a second side of the display panel 12 along the thickness direction of the display panel 12. The first image sensing module 13 is configured to receive the reflected light signal formed by the first light signal reflected on the first surface 11a of the protective layer 11, and the optical imaging element 14 is configured to receive the second light signal from an object 18 above the first surface 11a of the protective layer 11, and to conduct optical imaging according to the second light signal received by the optical imaging element 14. The second image sensing module 15 is configured to receive the second optical signal imaged by the optical imaging element 14. The object 18 may not be in contact with the first surface 11a of the protective layer 11, i.e. there may be a distance between the object 18 and the first surface 11a of the protective layer 11.

In some embodiments, the first image sensing module 13 is disposed between the display panel 12 and the optical imaging element 14. The first image sensing module 13 may be attached to a surface 12a of the second side of the display panel 12 along the thickness direction of the display panel 12. In this embodiment, the protective layer 11, the display panel 12 and the first image sensing module 13 constitute a near-field imaging module, which can be used to capture an image of an object near the first surface 11a of the protective layer 11, for example, the image of a fingerprint 17 in contact with the first surface 11a of the protective layer 11. When the near-field imaging module is used to capture the fingerprint 17, it can use the total reflection imaging principle of physical optics to image the fingerprint, that is, the first image sensing module 13 is configured to receive total reflection light formed by the total reflection of the first light signal on the first surface 11a of the protective layer 11, and take this part of the total reflection light as effective signal light carrying the fingerprint information and process the fingerprint image data to obtain the fingerprint image.

In some embodiments, there is a first distance between the optical imaging element 14 and the display panel 12 and a second distance between the optical imaging element 14 and the second image sensing module 15. Specifically, the display panel 12 may be disposed on an object-side focal plane of the optical imaging element 14, because light emitted from any point on the object focal plane is transformed into parallel light after being imaged by the optical imaging element 14, so that the display image on the display panel 12 can be imaged at infinity through the optical imaging element 14, which makes it equivalent to a uniform illumination light source, avoiding a situation where a display image with patterns is received by the second image sensing module 15 and is hard to be filtered out as an interference signal of the second light signal. The second image sensing module 15 may be disposed outside an image-side focal plane of the optical imaging element 14, i.e. the second distance is larger than an image-side focal distance of the optical imaging element 14, so that the object 18 above the first surface 11a of the protective layer 11 can form a real image in the second image sensing module 15 after being imaged by the optical imaging element 14.

In some embodiments, the second distance is adjustable within a preset range, and the preset range is set in such a way that an object 18 located above the first surface 11a of the protective layer 11 and at a distance from the first surface 11a within a range of 0.1 m to 1 m can form a clear image on the second image sensing module 15.

In some embodiments, the optical imaging element 14 may include a lens or a lens group, and the object 18 forming a clear image on the second image sensing module 15 includes: the distance among the object 18, the optical imaging element 14 and the second image sensing module 15 satisfies lens imaging formula:

$$\frac{1}{s} + \frac{1}{i} = \frac{1}{f},$$

wherein s is a third distance (that is, the distance between the object 18 and the optical imaging element 14), i is the second distance (that is, the distance between the optical imaging element 14 and the second image sensing module 15), and f is the focal distance of the optical imaging element 14.

In some embodiments, the image capturing device 10 also includes a distance adjusting device (not shown) configured to adjust the second distance within the preset range. Specifically, the distance adjusting device can include a voice coil motor adapted to adjust the second distance within a range of 0.5 mm.

In some embodiments, the first image sensing module 13 is disposed opposite to the optical imaging element 14, and an area 131 of the first image sensing module 13 opposite to the optical imaging element 14 has light transmittance, so that the optical imaging element 14 can receive the second light signals from the object 18 above the first surface 11*a* of the protective layer 11 as many as possible.

Specifically, the first image sensing module 13 can be an image sensor fabricated in an amorphous silicon thin film transistor (TFT) process based on a glass substrate. TFT image sensor includes a plurality of photosensitive pixels, each photosensitive pixel can include a pixel circuit and a photosensitive element, the pixel circuit includes a thin film transistor, and the photosensitive element includes a photodiode or a photosensitive transistor. The photodiode and the thin film transistor of the light transmitting area 131 can be made on a transparent material.

In some embodiments, the second image sensing module 15 may be an image sensor fabricated in a CMOS process based on a silicon wafer, and the optical imaging element 14 may be a lens or a lens group configured to image the object 18 according to the principle of geometric optics.

In this embodiment, the optical imaging element 14 and the second image sensing module 15 constitute the mid-field imaging module, which can be used for optical imaging of the object 18 located above the first surface 11*a* of the protective layer 11 and at a preset distance from the first surface 11*a* of the protective layer 11. For example, when the mid-field imaging module is applied to a full-screen smart device, it can be used for under-screen face recognition.

In some embodiments, the image capturing device 10 may also include a touch screen 16. The touch screen 16 is disposed between the protective layer 11 and the display panel 12 and is configured to detect a touch signal from the first surface 11*a* of the protective layer 11.

In some embodiments, the image capturing device 10 may also include a processing module (not shown). The processing module is configured to transmit a display driving signal to the display panel 12 when the touch screen 16 detects the touch signal. The processing module is further configured to generate a first image information according to the reflected light signal received by the first image sensing module 13, and to generate a second image information according to the second light signal received by the second image sensing module 15.

Figure 2:
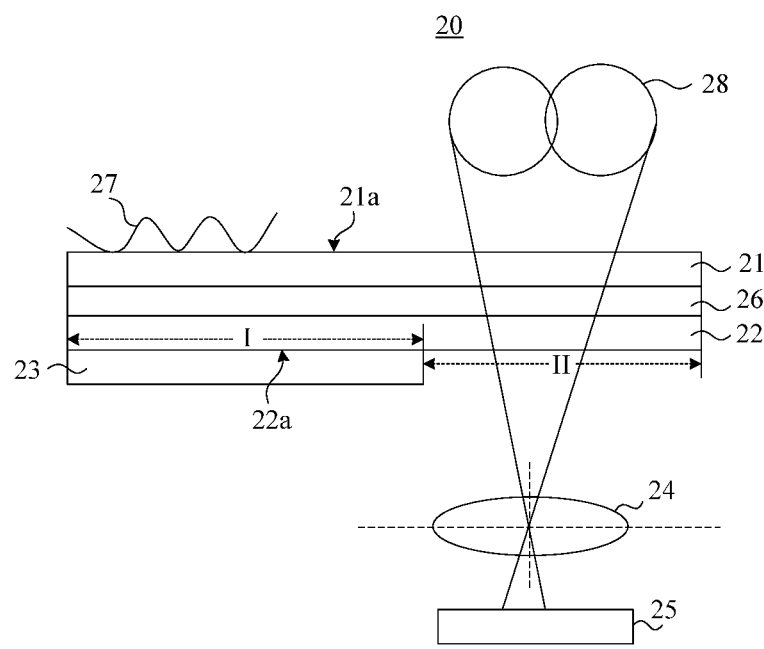
FIG. 2 is a structural schematic view of an image capturing device 20 according to another embodiment of the present disclosure.

Referring to FIG. 2, FIG. 2 is a structural schematic view of an image capturing device 20 according to another embodiment of the present disclosure.

In some embodiments, the image capturing device 20 may include a protective layer 21, a display panel 22, a first image sensing module 23, an optical imaging element 24, and a second image sensing module 25.

In some embodiments, the image capturing device 20 may further include a touch screen 26 disposed between the protective layer 21 and the display panel 22.

The difference between this embodiment and the embodiment shown in FIG. 1 is that a surface 22*a* of a second side of the display panel 22 along its thickness direction includes a first region I and a second region II outside the first region I. The first image sensing module 23 is disposed in the first region I, and the optical imaging element 24 is disposed opposite to the second region II, so that the second optical signal passes through the protective layer 21, the touch screen 26 and the display panel 22 and is directly received by the optical imaging element 24 without passing through the first image sensing module 23, which enhances the intensity of the second light signal received by the second image sensing module 25 and further improves the signal-to-noise ratio of the image collected by the second image sensing module 25. Compared with the embodiment shown in FIG. 1, this embodiment can realize fingerprint recognition in a partial area of a first surface 21*a* of the protective layer 21 (i.e., a partial area directly opposite to the first region I of the display panel 22).

When the image capturing device 20 of this embodiment is applied to the full-screen smart device, the optical imaging element 24 and the second image sensing module 25 may be disposed directly below an edge area of the full screen to realize face recognition. For example, a notch screen or water drop screen area of some mobile phones on the market today can be used to dispose the mid-field imaging module in the image capturing device 20 according to the embodiment of the present disclosure, that is, the optical imaging element 24 and the second image sensing module 25.

It should be noted that, in order to clearly show the positional relationship between the first image sensing module 23 and the second image sensing module 25, a ratio of the second region II to the display panel 22 is enlarged. In practical applications, a ratio of the first region I to the second region II can be set as required, which is not limited in the embodiment of the present disclosure.

For the structures and functions of each component of the image capturing device 20 in this embodiment, reference may be made to the embodiment shown in FIG. 1, and details are not described herein again.

Figure 3:
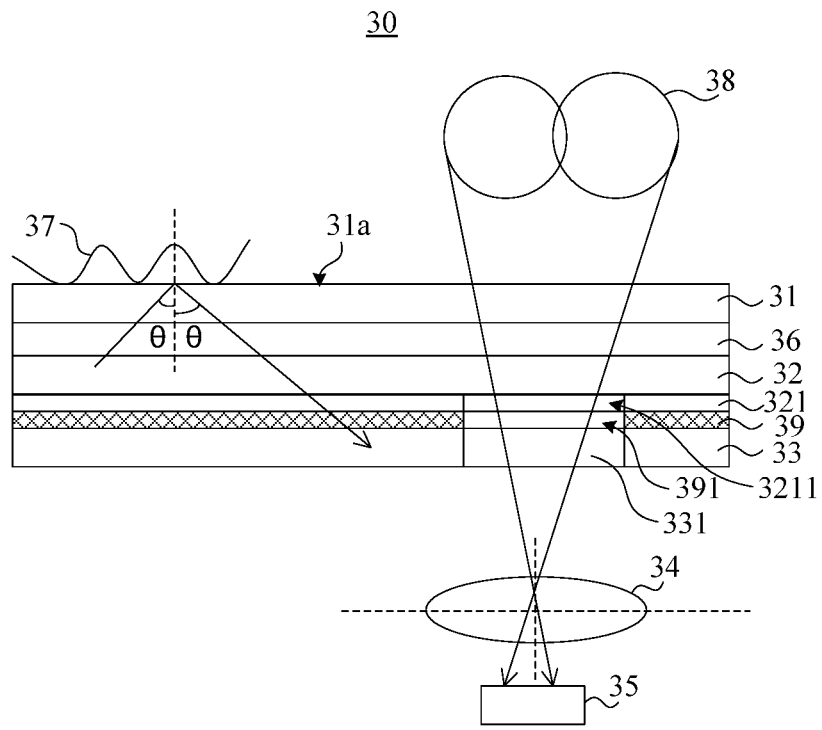
FIG. 3 is a structural schematic view of an image capturing device 30 according to yet another embodiment of the present disclosure.

Referring to FIG. 3, FIG. 3 is a structural schematic view of an image capturing device 30 according to yet another embodiment of the present invention.

In some embodiments, the image capturing device 30 may include a protective layer 31, a display panel 32, a first image sensing module 33, an optical imaging element 34, and a second image sensing module 35.

In some embodiments, the image capturing device 30 may further include a touch screen 36 disposed between the protective layer 31 and the display panel 32.

The difference between this embodiment and the embodiment shown in FIG. 1 is that the image capturing device 30 may further include a reflective film 321 and/or an optical filtering element 39. The reflective film 321 is disposed on a surface of a second side of the display panel 32 along a thickness direction of the display panel 32, and configured to reflect the first light signal emitted by display pixels of the display panel 32 toward the first image sensing module 33, preventing the first light signal from being directly received by the first image sensing module 33, which may lead to an increase in ambient light and a decrease in the signal light proportion and further lead to a decrease in the signal-to-noise ratio of the captured image. In some embodiments, the reflective film 321 may be a metal film or a non-metal film. When the reflective film 321 is a metal film, the reflective film 321 may have an extremely thin thickness to achieve at least partial light transmittance.

The optical filtering element 39 is disposed between the display panel 32 and the first image sensing module 33. The optical filtering element 33 is configured to transmit light having incident angle and wavelength which meet preset conditions, and filter out light having incident angle and wavelength which do not meet the preset conditions. In some embodiments, the preset conditions satisfy the formula: $2=nd \cos \theta$, wherein $\lambda$ and $\theta$ are respectively the wavelength of incident light and an exit angle of an incident interface of the optical filtering element 39, n is a refractive index of the optical filtering element 39, d is a thickness of the optical filtering element 39, and the exit angle $\theta$ is a function of a light incidence angle $\theta'$ of the incident interface of the optical filtering element 39.

In some embodiments, the optical filtering element 39 may be an optical thin film formed by a combination of several layers of materials with different optical refractive indexes, or a photonic crystal structure device with periodically varying refractive indexes.

In some embodiments, an area of the reflective film 321 directly opposite to the optical imaging element 34 is provided with a first opening 3211. An area of the optical filtering element 39 directly opposite to the optical imaging element 34 is provided with a second opening 391, and an area of the first image sensing module 33 directly opposite to the optical imaging element 34 is provided with a light transmitting area 331. The first opening 3211, the second opening 391 and the light transmitting area 331 are favorable for the optical imaging element 34 and the second image sensing module 35 to receive the second optical signal from an object 38 as many as possible, and can prevent the second optical signal from being blocked by the reflective film 321, the optical filtering element 39 and the first image sensing module 33.

For the structures and functions of each component of the image capturing device 30 in this embodiment, reference may be made to the embodiment shown in FIG. 1, and details are not described herein again.

Figure 4:
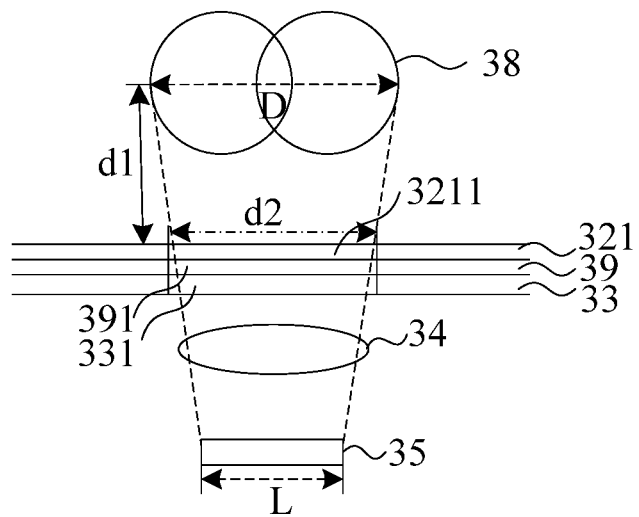
FIG. 4 is a partial enlarged view of a first opening 3211, a second opening 391 and a light transmitting area 331 of the image capturing device 30 according to the embodiment shown in FIG. 3 of the present disclosure.

Referring to FIG. 4, FIG. 4 is a partial enlarged view of the first opening 3211, the second opening 391 and the light transmitting area 331 of the image capturing device 30 according to the embodiment shown in FIG. 3 of the present disclosure.

In some embodiments, the first opening 3211, the second opening 391 and the light transmitting region 331 may have the same size d2, and the method shown in FIG. 4 may be used to approximately determine the size d2 of the plurality of openings and the light transmitting area. To simplify the description, the structure of the protective layer 31 and the display panel 32 are omitted in FIG. 4.

Referring to FIG. 3, if a transverse size of the object 38 above the first surface 31a of the protective layer 31 is D, and a transverse size of the second image sensing module 35 is L, then a trapezoid can be formed with the transverse size of the second image sensing module 35 as an upper bottom and the transverse size of the object 38 as a lower bottom (as shown by dotted lines in FIG. 4), and the size of the reflective film 321, the optical filtering element 39 and the first image sensing module 33 between two waists of the trapezoid can be approximately taken as the size d2 of the first opening 3211, the second opening 391 and the light transmitting area 331.

The distance between the center of the object 38 and the protective layer 31 is d1 (the protective layer 31 is omitted in FIG. 4, so the distance between the object 38 and the reflective film 321 is shown as a reference). The larger the distance d1 is, the smaller the size d2 of the opening and the light transmitting area is. Therefore, in order to make the second image sensing module 35 receive the second light signal as many as possible, the size d2 of the opening and the light transmitting area is calculated according to the minimum distance from the object 38 for mid-field imaging to the protective layer 31.

In some embodiments, the distance between the object 38 for mid-field imaging and the first surface 31a of the protective layer 31 ranges from 0.1 m to 1 m. In the case that the structure size of the image capturing device 30 is set, the size d2 of the first opening 3211, the second opening 391 and the light transmitting area 331 can be estimated according to the object 38 with d1=0.1 m and D=30 cm. Specifically, the size d2 can be 2 cm.

In some embodiments, the size d2 of the first opening 3211, the second opening 391 and the light transmitting area 331 can also be estimated according to the object 38 with d1=0.5 m and D=30 cm. Specifically, the size d2 can be 3.5 mm.

Figure 5:
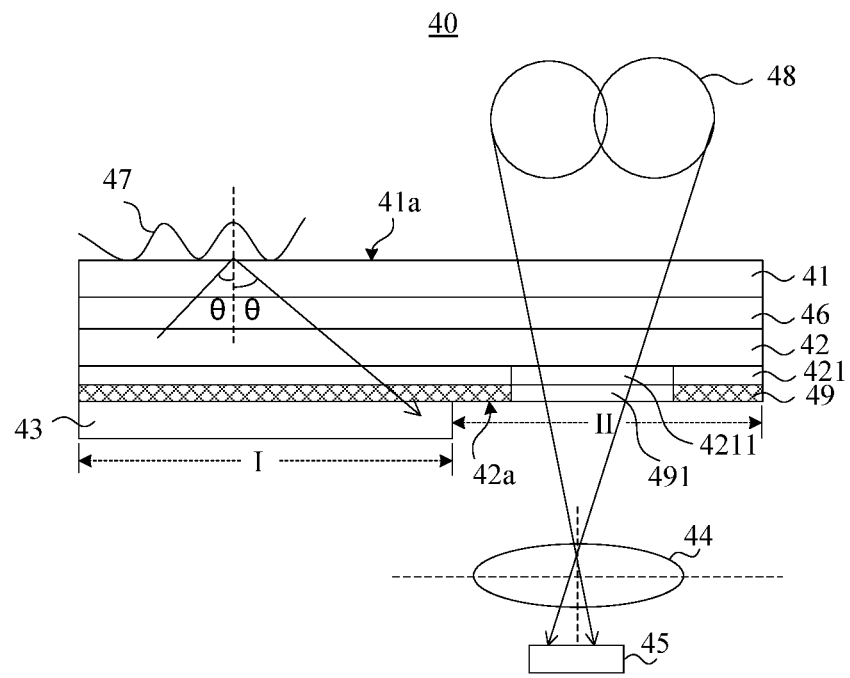
FIG. 5 is a structural schematic view of an image capturing device 40 according to yet another embodiment of the present disclosure.

Referring to FIG. 5, FIG. 5 is a structural schematic view of an image capturing device 40 according to yet another embodiment of the present disclosure.

In some embodiments, the image capturing device 40 may include a protective layer 41, a display panel 42, a first image sensing module 43, an optical imaging element 44, and a second image sensing module 45.

In some embodiments, the image capturing device 40 may also include a touch screen 46 disposed between the protective layer 41 and the display panel 42.

The difference between this embodiment and the embodiment shown in FIG. 3 is that a surface 42a of a second side of the display panel 42 along a thickness direction of the display panel 42 includes a first region I and a second region II that lies outside the first region I. The first image sensing module 43 is disposed in the first region I, and the optical imaging element 44 is disposed opposite to the second region II, so that the second light signal can successively pass through the protective layer 41, the touch screen 46, the display panel 42, a first opening 4211 of the reflective film 421 and a second opening 491 of an optical filtering element 49, and can then be directly received by the optical imaging element 44, without passing through the first image sensing module 43, which enhances the intensity of the second optical signal received by the second image sensing module 45. Compared with the embodiment shown in FIG. 3, this embodiment can realize fingerprint recognition in a partial area of the first surface 41a of the protective layer 41 (that is, a partial area directly opposite to the first region I of the display panel 42).

The structure of the image capturing device 40 in this embodiment is similar to the embodiment shown in FIG. 2, and the structure design of the image capturing device 40 in the application of the full-screen smart device can refer to the relevant description of the embodiment in FIG. 2, which will not be described here.

Figure 6:
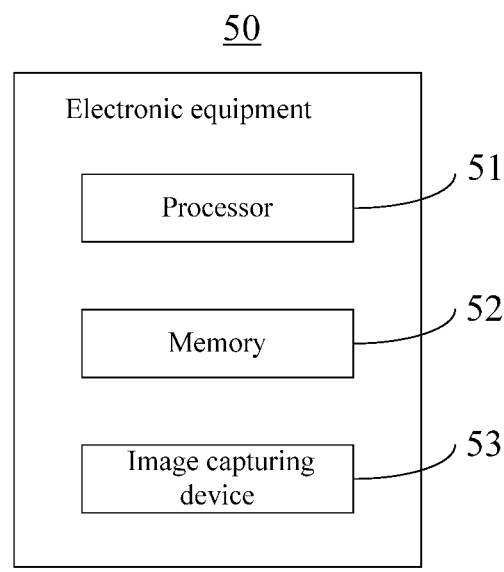
FIG. 6 is a structural schematic block diagram of an electronic equipment 50 according to an embodiment of the present disclosure.

Embodiments of the present disclosure also provide an electronic equipment. Referring to FIG. 6, FIG. 6 is a structural schematic view of an electronic equipment 50 according to one embodiment of the present disclosure. The electronic equipment 50 may include a processor 51, a memory 52, and an image capturing device 53 according to the preceding embodiments of the present disclosure.

In some embodiments, the processor 51 is configured to process a first image data collected by the first image sensing module and a second image data collected by the second image sensing module in the image capturing device 53. The memory 52 is configured to pre-store reference data, and to store image data collected by the image capturing device 53 in real time.

In some embodiments, the electronic equipment 50 may be a full-screen smart device. The first image data may be fingerprint image data, the second image data may be face image data, and the reference data includes fingerprint image data and face image data entered in advance by the user. The processor is further configured to compare the processed first image data and second image data with user fingerprint image data and the user face image data pre-stored in the memory 52 respectively, and to control screen unlocking of the full-screen smart device according to the comparison result.

In some embodiments, the full-screen smart device may be a mobile phone, or a tablet computer.

The image capturing device according to the embodiment of the present disclosure has both near-field and mid-field imaging functions, wherein the protective layer, the display panel, and the first image sensing module constitute the near-field imaging module, which can conduct optical imaging for an object near the first surface of the protective layer (such as an object in contact with the first surface of the protective layer); the optical imaging element and the second image sensing module constitute the mid-field imaging module, which can conduct optical imaging for an object having a distance from the first surface of the protective layer within a preset range. The near-field imaging module can be used for under-screen fingerprint recognition, and the mid-field imaging module can be used for under-screen face recognition, so the image capturing device can realize both under-screen fingerprint recognition and under-screen face recognition through an integrated structural design, which improves the function integration degree of the image capturing device applied in a full-screen smart device.

Further, the display panel is disposed on the object-side focal plane of the optical imaging element, so that a display image on the display panel can be imaged at infinity through the optical imaging element, thereby preventing the display image on the display panel from interfering the second light signal received from the object by the second image sensing module, and improving the signal-to-noise ratio of the image collected by the second image sensing module. The second image sensing module is disposed outside the image-side focal plane of the optical imaging element, so that the optical imaging element can clearly image the object having a distance from the first surface of the protective layer within a preset range to the second image sensing module.

Further, the optical imaging element is disposed opposite to the first image sensing module, and the area of the first image sensing module directly opposite to the optical imaging element has light transmittance, which enhances the intensity of the second light signal received by the second image sensing module, so as to improve the signal-to-noise ratio of the collected image.

Further, the image capturing device includes the optical filtering element, which can filter out ambient light and only allow the signal light meeting the band-pass condition to pass through, thus improving the signal-to-noise ratio of the image collected by the first image sensing module. The area of the optical filtering element opposite to the optical imaging element is provided with the opening, which can prevent the optical filtering element from filtering out the second light signal from the object above the surface of the protective layer, and realize the compatibility between the near-field imaging and the far-field imaging.

Further, the image capturing device includes the reflective film disposed on the surface of the second side of the display panel along its thickness direction and configured to reflect the first light signal emitted by the display pixels toward the first image sensing module, which enhances the intensity of the first light signal to the first surface of the protective layer used for collecting fingerprint image on one hand, and reduces the intensity of the first light signal emitted by the display panel and directly entering the first image sensing module on the other hand. Therefore, the signal-to-noise ratio of the image collected by the first image sensing module is improved. The area of the reflective film opposite to the optical imaging element is provided with the opening, which can prevent the reflective film from blocking the second light signal from the object above the first surface of the protective layer, and realizes the compatibility between the near-field imaging and the far-field imaging.

The electronic equipment according to the embodiment of the present disclosure includes the image capturing device, and have the capturing function of near-field and far-field images through the integrated structure design, and can be applied for both under-screen fingerprint recognition and under-screen face recognition.

Although the present disclosure has been disclosed above, the present disclosure is not limited thereto. Any changes and modifications may be made by those skilled in the art without departing from the spirit and scope of the present disclosure, and the scope of the present disclosure should be determined by the appended claims.

The invention claimed is:

1. An image capturing device, comprising:
   a protective layer, a display panel, a first image sensing module, an optical imaging element, and a second image sensing module;
   wherein the protective layer is disposed on a first side of the display panel along a thickness direction of the display panel and has a first surface configured for being contacted by a part to be detected;
   the display panel comprises a plurality of display pixels configured to emit a first light signal;
   the first image sensing module, the optical imaging element and the second image sensing module are disposed on a second side of the display panel along the thickness direction of the display panel;
   the first image sensing module is configured to receive a reflected light signal formed by the first light signal reflected on the first surface of the protective layer, the optical imaging element is configured to conduct optical imaging according to a second light signal received from an object above the first surface of the protective layer, and the second image sensing module is configured to receive the second optical signal imaged by the optical imaging element; and
   the protective layer, the display panel, and the first image sensing module constitute a near-field imaging module, and the optical imaging element and the second image sensing module constitute a mid-field imaging module, so that the image capturing device has both near-field and mid-field imaging functions;
   the display panel is disposed on an object-side focal plane of the optical imaging element, and the second image sensing module is disposed outside an image-side focal plane of the optical imaging element;
   wherein the first image sensing module is disposed between the display panel and the optical imaging element;
   wherein there is a first distance between the optical imaging element and the display panel, and a second distance between the optical imaging element and the second image sensing module;
   wherein the optical imaging element is disposed opposite to the first image sensing module, and an area of the first image sensing module opposite to the optical imaging element has light transmittance;
   wherein a size of the area of the first image sensing module opposite to the optical imaging element having light transmittance is determined according to a minimum distance from the object to the protective layer, a transverse size of the object, and a transverse size of the second image sensing module.

2. The image capturing device according to claim 1, wherein the first image sensing module is attached to a surface of the second side of the display panel along the thickness direction of the display panel.

3. The image capturing device according to claim 1, wherein the second distance is adjustable within a preset range, and the preset range is set in such a way that an object located above the first surface of the protective layer and at a distance from the first surface within a range of 0.1 m to 1 m forms a clear image in the second image sensing module.

4. The image capturing device according to claim 1, wherein a surface of the second side of the display panel along the thickness direction of the display panel comprises a first region and a second region outside the first region, the first image sensing module is disposed in the first region, and the optical imaging element is disposed opposite to the second region, the second light signal successively passes through the protective layer and the display panel, and is received by the optical imaging element.

5. The image capturing device according to claim 1, further comprising:
   an optical filtering element disposed between the display panel and the first image sensing module, wherein the optical filtering element is configured to transmit light having incident angle and wavelength which meet preset conditions, and to filter out light having incident angle and wavelength which do not meet the preset conditions.

6. The image capturing device according to claim 5, wherein an area of the optical filtering element opposite to the optical imaging element is provided with an opening.

7. The image capturing device according to claim 6, wherein a size of the opening is determined according to a minimum distance from the object to the protective layer, a transverse size of the object, and a transverse size of the second image sensing module.

8. The image capturing device according to claim 1, further comprising:
   a reflective film disposed on a surface of the second side of the display panel along the thickness direction of the display panel;
   wherein the reflective film is configured to reflect the first light signal emitted by the display pixels toward the first image sensing module.

9. The image capturing device according to claim 8, wherein an area of the reflective film opposite to the optical imaging element is provided with an opening.

10. The image capturing device according to claim 1, further comprising:
    a processing module, configured to transmit a display driving signal to the display panel, to generate a first image information according to the reflected light signal received by the first image sensing module, and to generate a second image information according to the second light signal received by the second image sensing module.

11. The image capturing device according to claim 10, further comprising:
    a touch screen disposed between the protective layer and the display panel and configured to detect a touch signal from the first surface of the protective layer;
    wherein the processing module is configured to transmit the display driving signal to the display panel when the touch screen detects the touch signal.

12. The image capturing device according to claim 1, wherein the protective layer comprises a light transmitting cover plate, the display panel comprises a self-luminous display screen the first image sensing module comprises a plurality of photosensitive pixels, each photosensitive pixel comprises a pixel circuit and a photosensitive element, the pixel circuit comprises a thin film transistor, and the photosensitive element comprises a photodiode or phototransistor; and/or the second image sensing module comprises a CMOS image sensor.

13. An electronic equipment, comprising: a processor, a memory and an image capturing device according to claim 1.

14. The electronic equipment according to claim 13, wherein the electronic equipment comprises a mobile phone or a tablet computer.

15. The image capturing device according to claim 1, wherein the near-field imaging module is configured to capture a fingerprint based on total reflection imaging principle, and the first image sensing module is configured to receive total reflection light formed by a total reflection of the first light signal on the first surface of the protective layer.

* * * * *